(12) United States Patent
Meade et al.

(10) Patent No.: US 8,901,666 B1
(45) Date of Patent: Dec. 2, 2014

(54) SEMICONDUCTING GRAPHENE STRUCTURES, METHODS OF FORMING SUCH STRUCTURES AND SEMICONDUCTOR DEVICES INCLUDING SUCH STRUCTURES

(71) Applicant: Micron Technology, Inc., Boise, ID (US)

(72) Inventors: Roy E. Meade, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/954,017

(22) Filed: Jul. 30, 2013

(51) Int. Cl.
| | | |
|---|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 21/02 | (2006.01) |
| H01L 29/16 | (2006.01) |

(52) U.S. Cl.
CPC ...... *H01L 29/1606* (2013.01); *H01L 21/02227* (2013.01)
USPC 257/369; 257/27; 257/E21.632; 257/E27.06; 257/E27.062; 438/199

(58) Field of Classification Search
USPC .............. 257/24, 27, 351, 368, 369, E27.062, 257/E27.06, E21.632; 438/199, 586
See application file for complete search history.

(56) References Cited

U.S. PATENT DOCUMENTS

| | | | |
|---|---|---|---|
| 7,732,859 B2 | 6/2010 | Anderson et al. |
| 8,247,806 B2 | 8/2012 | Chae et al. |
| 8,753,965 B2 * | 6/2014 | Avouris et al. ................ | 438/586 |

OTHER PUBLICATIONS

Fiori et al, Ultralow-Voltage Bilayer Graphene Tunnel FET, IEEE Electron Device Letters, vol. 30, No. 10, (Oct. 2009), pp. 1096-1098.
Rogers, John A., Nanoribbons on the Edge, Nature Nanotechnology, vol. 5, (Oct. 2010), pp. 698-699.
Ruan et al, Epitaxial Graphene on Silicon Carbide: Introduction to Structured Graphene, MRS Bulletin, vol. 37, (Dec. 2012), pp. 1138-1146.
Schwierz, Frank, Graphene Transistors, Nature Nanotechnology, vol. 5, (Jul. 2010), pp. 487-496.
Sprinkle et al., Scalable Templated Growth of Graphene Nanoribbons on SiC, Nature Nanotechnology, vol. 5, (2010), pp. 727-731.
Tao et al., Uniform 100mm Wafer-Scale Synthesis of Graphene on Evaporated Cu (111) Film with Quality Comparable to Exfoliated Monolayer, J. Phys. Chem. C, vol. 116, No. 45, (2012), pp. 24068-24074.

(Continued)

*Primary Examiner* — Hoai V Pham
(74) *Attorney, Agent, or Firm* — TraskBritt

(57) ABSTRACT

A semiconducting graphene structure may include a graphene material and a graphene-lattice matching material over at least a portion of the graphene material, wherein the graphene-lattice matching material has a lattice constant within about ±5% of a multiple of the lattice constant or bond length of the graphene material. The semiconducting graphene structure may have an energy band gap of at least about 0.5 eV. A method of modifying an energy band gap of a graphene material may include forming a graphene-lattice matching material over at least a portion of a graphene material, the graphene-lattice matching material having a lattice constant within about ±5% of a multiple of the lattice constant or bond length of the graphene material.

21 Claims, 5 Drawing Sheets

(56) References Cited

OTHER PUBLICATIONS

Yang et al., Graphene Barristor, a Triode Device with a Gate-Controlled Schottky Barrier, Sciencexpress, (May 17, 2012), 5 pages.

Young et al., Compilation of the Static Dielectric Constant of Inorganic Solids, J. Phys. Chem., Ref. Data, vol. 2, No. 2, (1973), pp. 313-407.

Zhang et al., Experimental Observation of Quantum Hall Effect and Berry's Phase in Graphene, Nature, vol. 438, (Sep. 2005). 5 pages.

* cited by examiner

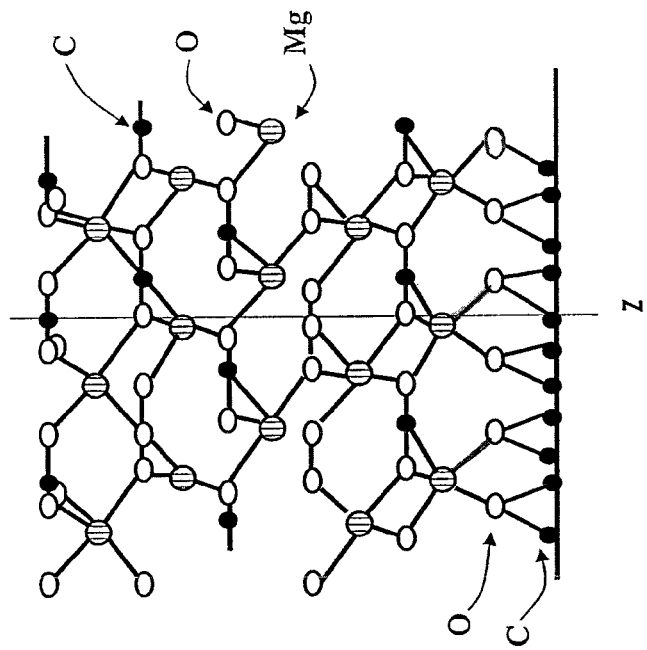
FIG. 1C
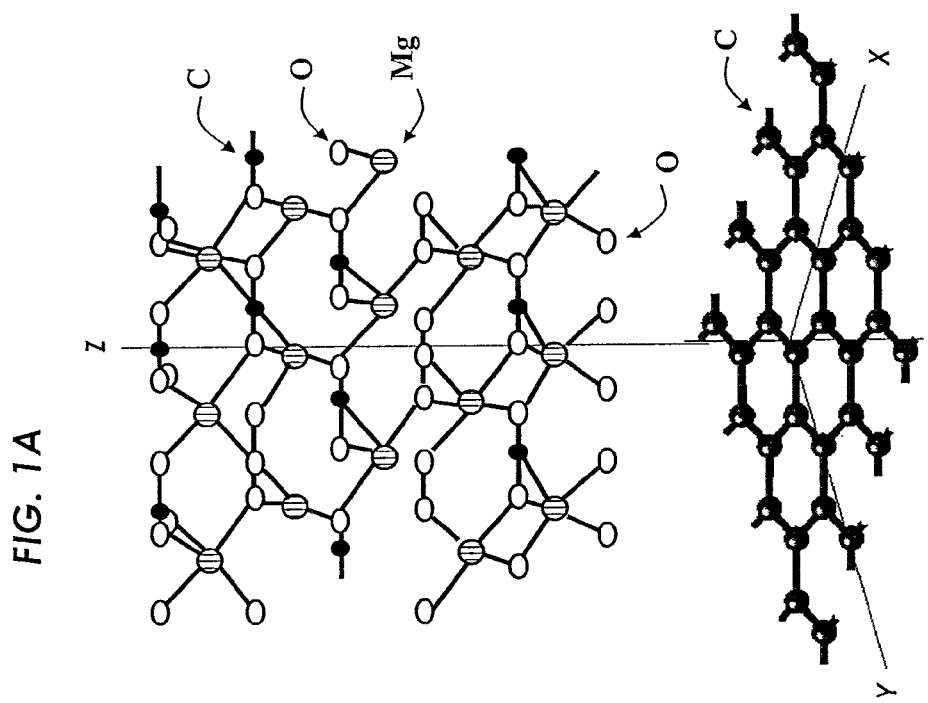
FIG. 1A
FIG. 1B

US 8,901,666 B1

SEMICONDUCTING GRAPHENE STRUCTURES, METHODS OF FORMING SUCH STRUCTURES AND SEMICONDUCTOR DEVICES INCLUDING SUCH STRUCTURES

FIELD

The present disclosure, in various embodiments, relates generally to semiconducting graphene structures, methods of forming such structures, and semiconductor devices including such structures. More specifically, embodiments of the present invention relate to semiconducting graphene structures having graphene materials and graphene-lattice matching materials in direct contact to the graphene materials, and to methods of forming such structures.

BACKGROUND

Silicon has been used for fabrication of various semiconductor devices, including field effect transistor (FET) devices. The processing limit for silicon is generally considered to be about 10 nm line width. With the continuing demands to decrease the size of semiconductor devices while increasing speed and integration density, the silicon semiconductor material is gradually approaching its processing limits.

Graphene is a single atomic layer (i.e., a monolayer) of graphite. Graphene has a two-dimensional structure and conducts electricity in a planar direction. The graphene lattice includes carbon atoms arranged in a hexagonal array with a carbon-carbon bond angle of 120 degrees, a carbon-carbon bond length ($r_{o,g}$) of 1.42 Å, and a lattice constant of about 2.46 Å. Graphene has high charge mobility of approximately 15,000 cm$^2$/Vs, high current carrying capability exceeding 1×10$^8$ A/cm$^2$, and excellent thermal conductivity. Therefore, graphene is being investigated as a next-generation material for replacing silicon in various semiconductor devices, including FET devices.

Graphene is a zero energy band gap material (i.e., there is no energy gap between the conduction and valence bands of graphene). In contrast, semiconductor materials have an energy band gap between the conduction and valence bands. Because of its zero energy band gap, graphene has a very large off current and consequently a very small on/off ratio of an operating current (hereinafter "on/off ratio"). Such a low on/off ratio limits the large integration and high-speed operation of the FET device. Furthermore, due to the very large off current of graphene, the FET devices using unmodified graphene (i.e., large-area graphene) cannot be switched off and are not suitable for logic applications.

Various attempts have been made to modify (i.e., open) the band gap structure of graphene. One approach has been to constrain unmodified graphene in one dimension by cutting it into narrow ribbons of less than a few tens of nanometers, known as graphene nanoribbons. The energy band gap of graphene nanoribbons is inversely proportional to the width of the nanoribbon. Therefore, to obtain graphene having an energy band gap useful for conventional FET devices, very narrow graphene nanoribbons with well-defined edges are required. Thus far, it has been a challenge to manufacture graphene in the size of several nanometers with uniform width, reduced edge roughness, and excellent quality. Accordingly, despite their excellent characteristics, the integration of graphene nanoribbons into semiconductor devices such as FET devices has been limited.

Graphene-silicon hydride structures have been investigated for fabrication of triode devices, wherein the on/off ratio of about 10$^5$ may be achieved by adjusting the gate voltage to control the graphene-silicon Schottky barrier. Although graphene has a zero energy band gap, the absence of Fermi-level pinning at the interface of graphene and silicon allows the barrier's height to be turned to 0.2 eVs.

U.S. Pat. No. 8,247,806, issued Aug. 21, 2012, discloses an FET device having a graphene channel layer. Although graphene has a zero energy band gap, the on/off ratio of the FET device is increased by applying voltage to the gate structure, thereby changing the energy level of the Fermi surface.

There exists a need for a method of modifying the energy band gap of graphene to allow the use of graphene in semiconductor devices as a replacement for silicon-based materials.

Further, there exists a need for an FET device that is compatible with standard complementary metal oxide semiconductor (CMOS) processing technologies and manufacturable with minimum number of processing acts.

BRIEF DESCRIPTION OF THE DRAWINGS

FIG. 1A is an isometric view of the structure of magnesium carbonate (MgCO$_3$) having a hexagonal crystal structure;

FIG. 1B is an isometric view of the structure of graphene lattice;

FIG. 1C is a side view of the structure of the semiconducting graphene structure having a graphene material on the hexagonal MgCO$_3$;

DETAILED DESCRIPTION

Figure 2B:
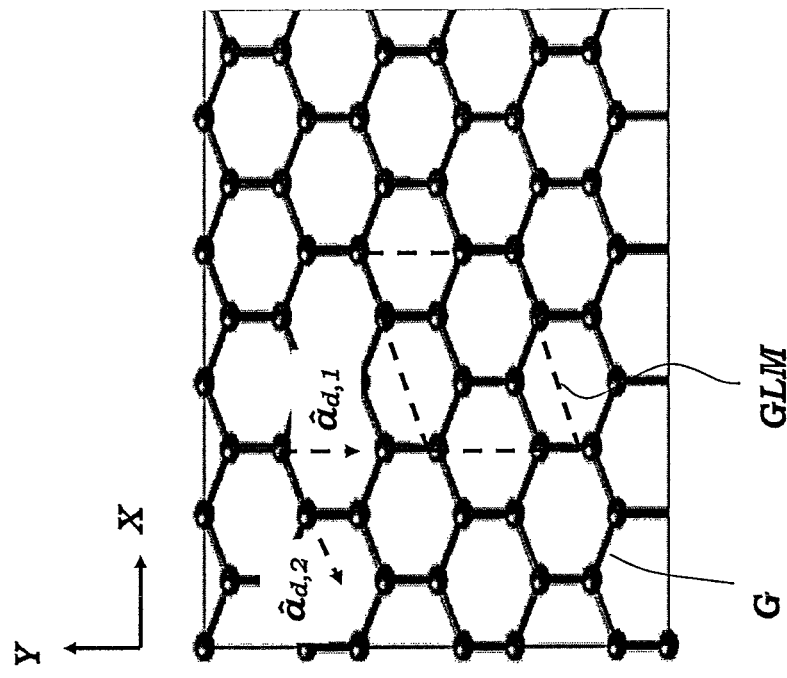
FIG. 2B is a top view showing the crystalline alignment between graphene (G) and the graphene-lattice matching material (GLM), wherein the unit cell vectors ($\hat{a}_{d,1}$ and $\hat{a}_{d,2}$) of the graphene-lattice matching material align to the graphene bond.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also the drawings accompanying the application are for illustrative purposes only, and are thus not necessarily drawn to scale. Elements common between figures may retain the same numerical designation.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate. The substrate may be doped or undoped. In one embodiment, the substrate may be p-doped polysilicon. In one embodiment, the substrate is crystallized Cu (111) material on an oxidized Si material such as, for example, a conventional 100-mm silicon oxide material. In another embodiment, the substrate is silicon carbide.

A semiconducting graphene structure may include a graphene material and a graphene-lattice matching material over at least a portion of the graphene material, wherein the graphene-lattice matching material has a lattice constant within about ±5% of a multiple of the lattice constant or bond length of the graphene. The lattice constant of graphene is about 2.46 Å and its bond length is about 1.42 Å. The distance 4.26 Å is a three-fold multiple of the bond length of graphene. A hexagonal material with a lattice constant within ±5% of this distance, which is about 4.05 Å to 4.47 Å would be a graphene-lattice matched with respect to the graphene bond length. By forming a graphene-lattice matching material containing oxygen over the graphene material, where the lattice constant of the graphene-lattice matching material is within 5% of the bond length of the graphene material, the graphene material is converted from a conductive material to a semiconductive material. The graphene-lattice matching material is bonded to the graphene material at an interface between the two materials. Utilizing a graphene-lattice matching material having a lattice constant outside this range may cause a significant strain at the interface of graphene and the graphene-lattice matching material, disrupt the crystalline structure, and increase the likelihood of lattice relaxation. Such disruption of the crystalline structure may create defect states, which in turn degrades the performance. Additional graphene-lattice matching materials may be conceived, including different integer multiples (e.g., one, two, four, etc.) and matching the lattice constant of graphene in addition to matching the bond length of graphene.

In some embodiments, the graphene-lattice matching material may have a hexagonal crystal structure with a lattice constant within about ±5% of a multiple of the lattice constant or bond length of the graphene.

Non-limiting examples of graphene-lattice matching materials having hexagonal crystal structures and lattice constants within about ±5% of a multiple of the bond length of graphene include magnesium carbonate ($MgCO_3$) or aluminum borate. However, as described in more detail below, other materials may be used as the graphene-lattice matching material.

FIG. 1A is an isometric view of the structure of hexagonal $MgCO_3$ with designations of carbon atoms (C), magnesium atoms (Mg) and oxygen atoms (O). The unit cell dimensions of $MgCO_3$ are approximately 4.45 (X-axis), 4.45 (Y-axis), and 13.71 (Z-axis). Since the lattice constant of the hexagonal $MgCO_3$ is within about ±5% of a multiple of the bond length of graphene, magnesium carbonate may be used as the graphene-lattice matching material. The bond between graphene and $MgCO_3$ is stable, with a bond energy of 0.8 eV per oxygen atom in contact with graphene.

FIG. 1B illustrates an isometric view of the structure of graphene, which is a monolayer of graphite.

FIG. 1C is a side view of the structure of the semiconducting graphene structure, wherein hexagonal $MgCO_3$ is used as the graphene-lattice matching material and formed over the graphene to modify the energy band gap of the graphene. The graphene-lattice matching material is bonded to the graphene. The graphene-lattice matching material may be formed thick enough to prevent leakage or direct tunneling. In FIGS. 1A and 1C, the $MgCO_3$ is shown to have three monolayers with one monolayer, an exterior monolayer interfacing (i.e., reacting) with the graphene. The oxygen atoms on the exterior monolayer of $MgCO_3$ may bond to the carbon atoms of the graphene.

Although FIGS. 1A and 1C show the $MgCO_3$ having three monolayers, it is understood that the $MgCO_3$ may have less than three monolayers or more than three monolayers.

In some embodiments, the semiconducting graphene material may include monolayers of graphene-lattice matching material. In some embodiments, the semiconducting graphene material may include more than three monolayers of graphene-lattice matching material to prevent an undesirable leakage problem that may cause direct tunneling.

A method of forming a semiconducting graphene structure may include forming a graphene-lattice matching material over a graphene material, wherein the graphene-lattice matching material has a lattice constant within about ±5% of a multiple of the lattice constant or bond length of the graphene material.

The graphene-lattice matching material may be formed over the graphene material using any conventional technique. By way of non-limiting examples, the graphene-lattice, matching material may be formed over the graphene material using atomic layer deposition (ALD), chemical vapor deposition (CVD), physical vapor deposition (PVD), or an epitaxial growth process. In some embodiments, the graphene-lattice matching material may be bonded to the graphene material. The graphene-lattice matching material and the graphene material may react at an interface of the two materials. By way of non-limiting examples, the graphene-lattice matching material may be bonded to the graphene material by annealing or by applying heat during the growth of the graphene-lattice matching material on the graphene material.

The periodicity of the graphene-lattice matching material may influence the overlay and alignment of the unit cell vectors of the graphene-lattice matching material to the graphene. Two factors may be considered in selecting the graphene-lattice matching material to achieve crystalline alignment between the graphene and the graphene-lattice matching material: the direction of the unit cell vectors of the graphene-lattice matching material, and the magnitude of the unit cell vectors.

Figure 2A:
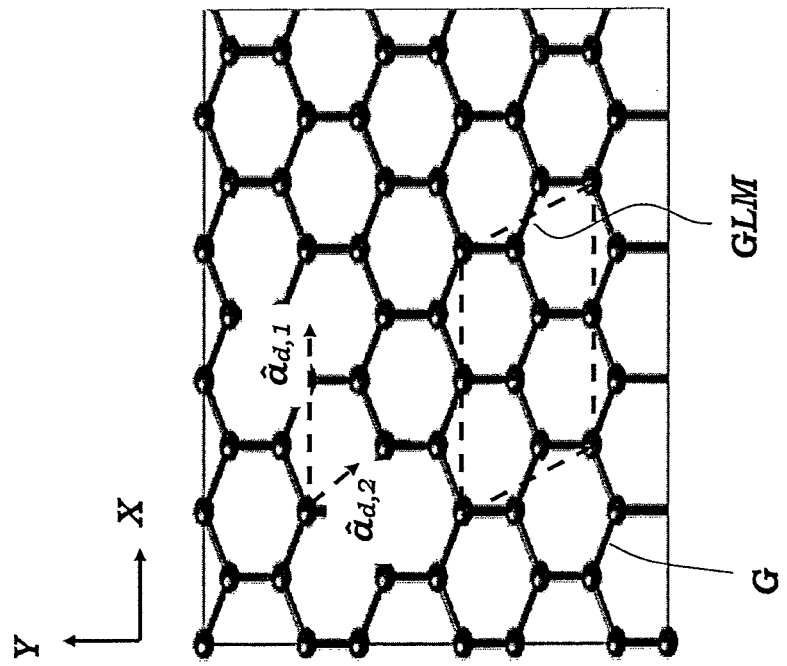
FIG. 2A is a top view showing the crystalline alignment between graphene (G) and the graphene-lattice matching material (GLM), wherein the unit cell vectors ($\hat{a}_{d,1}$ and $\hat{a}_{d,2}$) of the graphene-lattice matching material align to the graphene lattice vector.

The direction of the unit cell vectors may govern the orientation of the graphene-lattice matching material in relation to the graphene. FIGS. 2A and 2B show two different orientations of the graphene-lattice matching material (GLM) having hexagonal crystal structure over the graphene (G). The hexagonal graphene-lattice matching material (GLM, in dashed lines) is overlaid over the two-dimensional crystal structure of graphene (G). The unit cell vectors of the graphene-lattice matching material (GLM) may align to the graphene lattice vector as shown in FIG. 2A, or align to the graphene bond as shown in FIG. 2B. The primary difference between FIGS. 2A and 2B is the relative orientation of the unit cell of the graphene-lattice matching material (GLM) to the graphene lattice.

In FIG. 2A, the unit cell vectors of the graphene-lattice matching material (GLM) align to the graphene lattice vector. Vectors $\hat{a}_{d,1}$ and $\hat{a}_{d,2}$ show the proper orientation of the unit cell of the graphene-lattice matching material, wherein the vectors $\hat{a}_{d,1}$ and $\hat{a}_{d,2}$ may be defined as follows:

$$\hat{a}_{d,1} = \sqrt{3}\, a_g \cdot \hat{x}$$

$$\hat{a}_{d,2} = \frac{\sqrt{3}}{2} a_g \cdot \hat{x} - \frac{3}{2} a_g \cdot \hat{y}$$

$$a_g = \sqrt{3} \cdot r_{0,g}$$

wherein $r_{o,g}$ is the graphene bond length, $a_g$ is the graphene lattice constant, $\hat{x}$ is a unit vector in direction of the x-axis, $\hat{y}$ is a unit vector in direction of the y-axis.

In FIG. 2B, the unit cell vectors of the graphene-lattice matching material (GLM) align to the graphene bond. Vectors $\hat{a}_{d,1}$ and $\hat{a}_{d,2}$ show the proper orientation of the unit cell of the graphene-lattice matching material (GLM), wherein the vectors $\hat{a}_{d,1}$ and $\hat{a}_{d,2}$ may be defined as following:

$$\hat{a}_{d,1} = -\sqrt{3}\, a_g \cdot \hat{y}$$

$$\hat{a}_{d,2} = -\frac{3}{2} a_g \cdot \hat{x} - \frac{\sqrt{3}}{2} a_g \cdot \hat{y}$$

$$a_g = \sqrt{3} \cdot r_{0,g}$$

wherein $r_{o,g}$ is the graphene bond length, $a_g$ is the graphene lattice constant, $\hat{x}$ is a unit vector in direction of the x-axis, and $\hat{y}$ is a unit vector in direction of the y-axis.

In addition to the direction of the unit cell vectors (i.e., orientation of the grapheme-lattice matching material in relation to the graphene lattice), the magnitude of the vectors governs the proper crystalline alignment between the graphene material and the graphene-lattice matching material.

To achieve desirable periodic alignment between the graphene and the graphene-lattice matching material where the unit cell vectors of the graphene-lattice matching material align to the graphene lattice vector, the magnitude of the unit cell vectors of the graphene-lattice matching material may be an m multiple of the lattice constant ($a_g$) of the graphene material as shown below in equation (1):

$$a_d = m \cdot a_g \pm 5\%\, m \cdot a_g \quad (1)$$

To achieve desirable periodic alignment between the graphene and the graphene-lattice matching material where the unit cell vectors of the graphene-lattice matching material align to the graphene bonds, the magnitude of the unit cell vectors of the graphene-lattice matching material may be an m multiple of the graphene bond length ($r_{o,g}$) of the graphene material as shown in equation (2):

$$a_d = m \cdot r_{o,g} \pm 5\%\, m \cdot r_{o,g} \quad (2)$$

The formation of graphene-lattice matching material on the graphene may modify the energy band gap of the graphene material without substantially altering the periodicity of the graphene material.

The semiconducting graphene structure may have an energy band gap of at least about 0.5 eV. In some embodiments, the semiconducting graphene structure may have an energy band gap of from about 1 eV to about 2 eV.

Figures 3A, 3B, 3C:
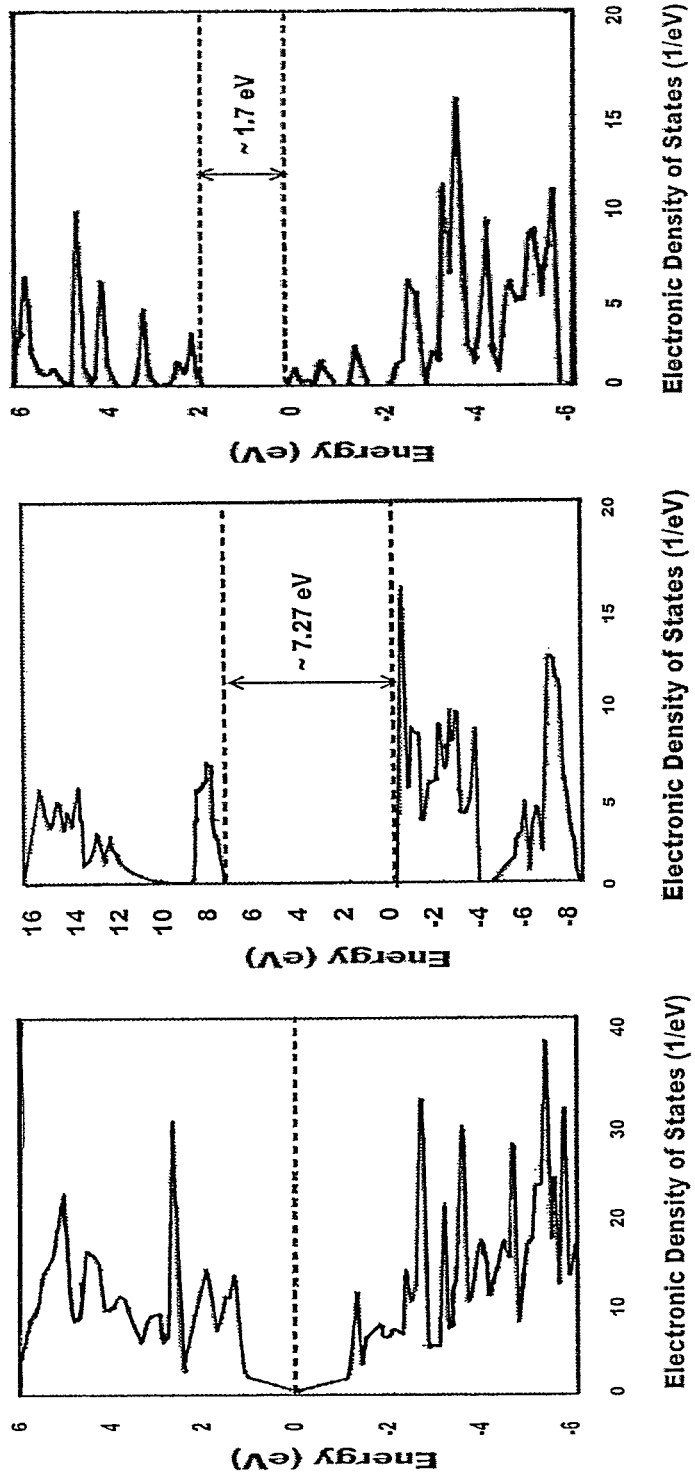
FIG. 3A shows the electronic density of states (EDOS) of the unmodified graphene, as calculated using density functional theory (DFT) with plane-waves and hybrid functional (HSE06)
FIG. 3B shows the electronic density of states (EDOS) of bulk hexagonal MgCO$_3$, as calculated using density functional theory (DFT) with plane-waves and hybrid functional (HSE06)
FIG. 3C shows the electronic density of states (EDOS) of the semiconducting graphene structure that includes graphene and MgCO$_3$ graphene-lattice matching material over the graphene, as calculated using density functional theory (DFT) with plane-waves and hybrid functional (HSE06)

The electronic density of states (EDOS) of the unmodified graphene material, the graphene-lattice matching material, and the semiconducting graphene structure may be calculated using density functional theory (DFT) with plane-waves and hybrid functional (e.g., HSE06, B3LYP, etc.). FIGS. 3A, 3B and 3C show EDOS of unmodified graphene, bulk hexagonal $MgCO_3$, and the semiconducting graphene structure having graphene and the hexagonal $MgCO_3$, respectively.

As shown in FIG. 3A, the energy band gap of unmodified graphene is zero. The energy band gap of hexagonal $MgCO_3$ is about 7.27 eV, as shown in FIG. 3B. The semiconducting graphene structure having graphene and the hexagonal $MgCO_3$ as the graphene-lattice matching material has an energy band gap of about 1.7 eV, as shown in FIG. 3C. Therefore, the energy band gap of graphene may be increased from zero eV to approximately 1.7 eV by forming the hexagonal $MgCO_3$ on the graphene material. Therefore, the semiconducting graphene structure may be used as an alternative to silicon-based materials in various semiconductor devices, including, but not limited to, FET, triodes, diodes, or resistive switching devices.

Furthermore, the hexagonal $MgCO_3$ has an energy band gap of about 7.27 eV (as shown in FIG. 3B) and permittivity of about 8.1. Thus, it may also function as dielectric material such as gate dielectric material for the FET devices.

In addition to $MgCO_3$, other crystal structures having a lattice constant within about ±5% of a multiple of the lattice constant or bond length of the graphene material may be used as the graphene-lattice matching material. Further non-limiting examples of graphene-lattice matched material may be $Ni_3TeO_6$, $Li_2ReO_3$, $LiNbO_3$, $NiTiO_3$, $MgTiO_3$, $MgSiO_3$, $FeTiO_3$, $GeMnO_3$, $LiASO_3$, $Al_2O_3$, $Ti_2O_3$, $Rh_2O_3$, $Fe_2O_3$, $Cr_2O_3$, $CaCO_3$, $V_2O_3$, $LuBO_3$, $MnCO_3$, $FeCO_3$, $Ga_2O_3$, $YbBO_3$, or $NaNO_3$.

In some embodiments, the crystallized Cu (111) on a conventional oxidized Si wafer, such as 100-mm Si wafer, may be used as the substrate. The graphene may be grown on crystallized Cu (111) material on conventional oxidized 100-mm Si wafers as known in the art. After the formation of graphene on the crystallized Cu (111) structure, the graphene-lattice matching material may be formed over the graphene to produce the semiconducting graphene structure.

The semiconducting graphene structure may be used in the fabrication of various semiconductor structures and devices, employing conventional fabrication processing technologies and manufacturable with minimum number of processing acts.

In one embodiment, the semiconducting graphene structure is used in the fabrication of an FET device, employing conventional fabrication processing technologies for FET devices, which are not described in detail herein.

A semiconductor device, such as an FET device, may include a source, a drain, a gate structure, and a semiconducting graphene structure adjacent to at least one of the source and drain, wherein the semiconducting graphene structure may include a graphene material and a graphene-lattice matching material over at least a portion of the graphene material, the graphene-lattice matching material having a lattice constant within about ±5% of a multiple of the lattice constant or bond length of the graphene material.

In some embodiments, at least one of the source and the drain of the semiconductor device may include unmodified graphene.

In some embodiments, the graphene-lattice matching material of the semiconducting graphene structure may be in direct contact with the gate structure, and therefore also function as a dielectric gate material.

In some embodiments, the FET device may further include a dielectric gate material between the graphene-lattice matching material and the gate structure.

Figures 4A, 4B:
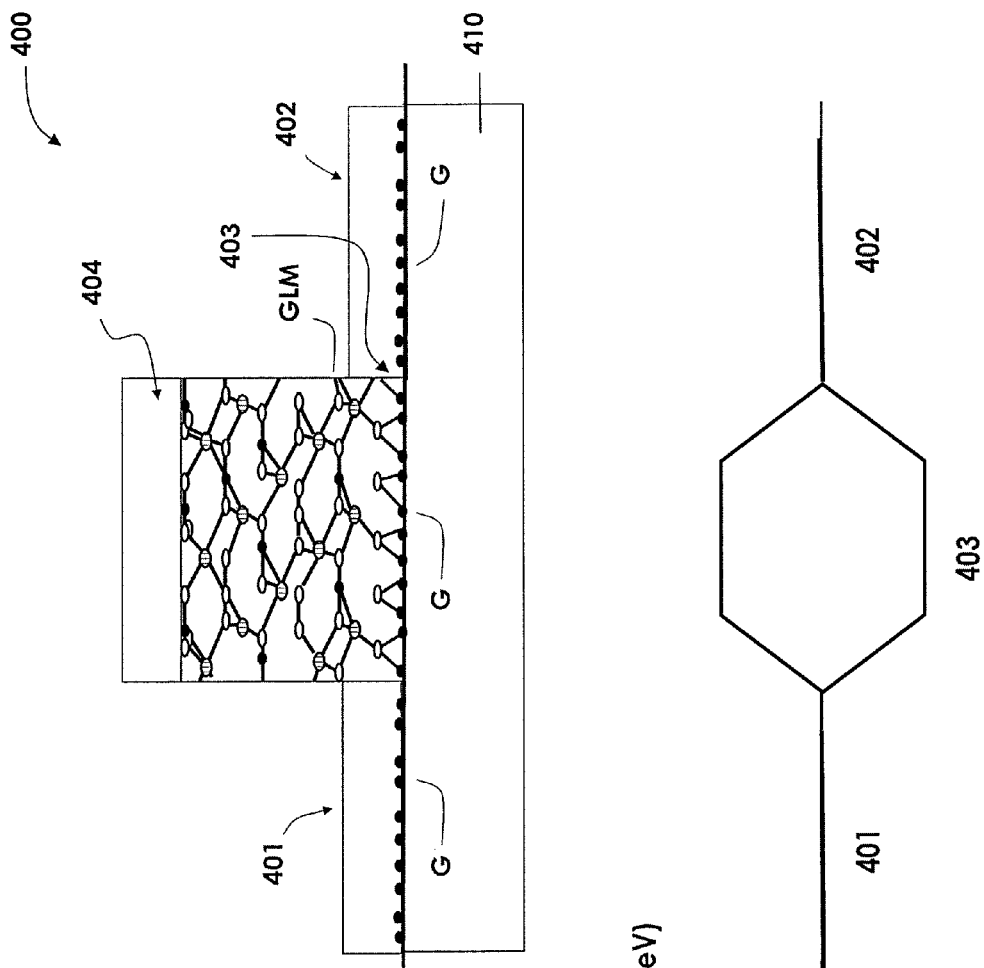
FIG. 4A is a side view of a semiconductor device of an embodiment.
FIG. 4B is a graph showing the corresponding energy bands along the side view of the semiconductor device shown in FIG. 4A.

FIG. 4A is a side view of a semiconductor device 400 of one embodiment, wherein the device includes a source (401), a drain (402), a semiconducting graphene structure (403), a gate structure (404), and a substrate (410). The source (401) and drain (402) each includes graphene material (G). The semiconducting graphene structure (403) is adjacent to the source (401) and the drain (402). The semiconducting graphene structure (403) includes a graphene material (G) and a graphene-lattice matching material (GLM) over at least a portion of the graphene material. The graphene-lattice matching material (GLM) is in direct contact with the gate structure (404); therefore, the graphene-lattice matching material (GLM) of the semiconducting graphene structure (403) may also function as a gate dielectric material.

FIG. 4B is a graph showing the corresponding energy bands along the side view of the semiconductor device shown in FIG. 4A. Each of the source (401) and the drain (402) is made of unmodified graphene; therefore, each exhibits a zero energy band gap. The semiconducting graphene structure (403) located between the source (401) and the drain (402) shows an energy band gap of about 1.7 eV.

Figure 5:
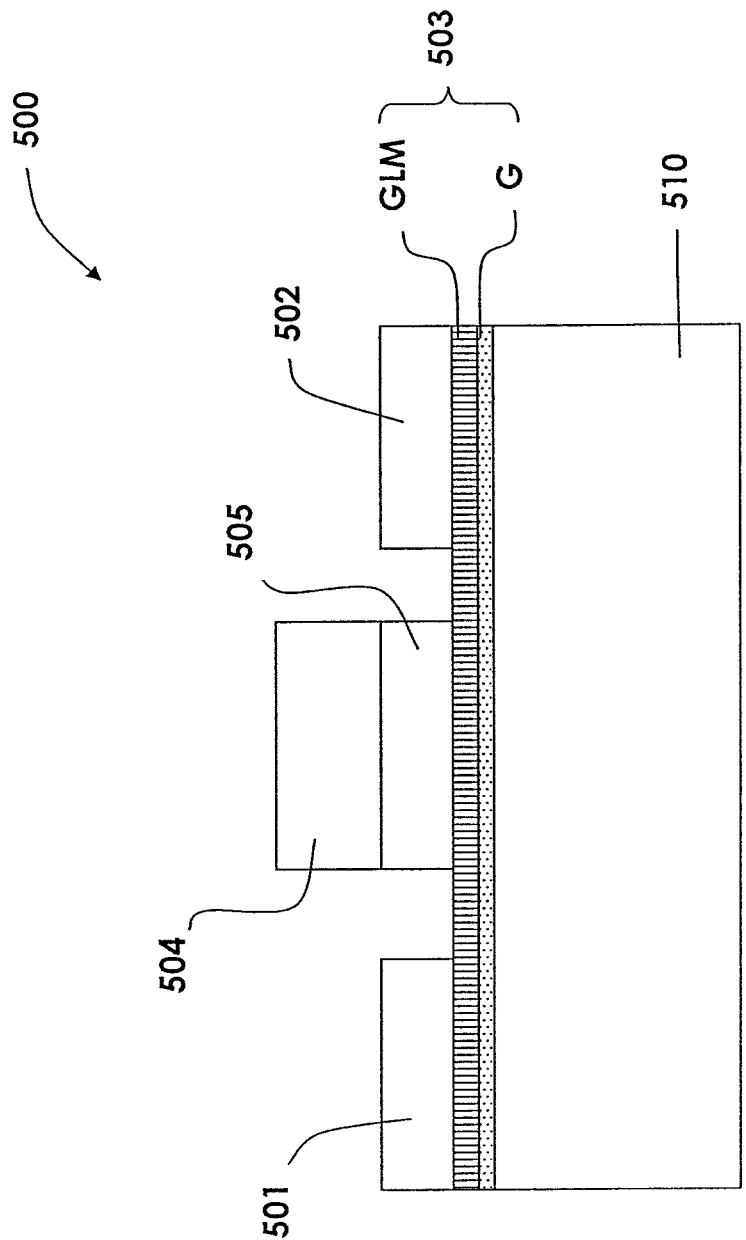
FIG. 5 is a side view of a semiconductor device of another embodiment.

FIG. 5 is a side view of a semiconductor device 500 of one embodiment, wherein the device includes a substrate (510), a source (501), a drain (502), a channel material connecting the source (510) to the drain (502) and including a semiconducting graphene structure (503), a gate structure (504), and a gate dielectric material (505) between the semiconducting graphene structure (503) and the gate structure (504). The semiconducting graphene structure (503) may include a graphene material (G) and a graphene-lattice matching material (GLM) over at least a portion of the graphene material.

Although the semiconductor devices 400 of FIGS. 4A and 500 of FIG. 5 are shown, it is understood that other structures of the semiconductor devices may be formed. As a non-limiting example, the semiconductor devices may have an upper gate structure as shown in FIGS. 4A and 5, wherein the gate structure is disposed above the semiconducting graphene structure, the source, and the drain. In addition, as another non-limiting example, the semiconductor devices may have a lower gate structure, wherein the gate structure is disposed below the semiconducting graphene structure, the source, and the drain.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A semiconductor structure, comprising:
a graphene material; and
a graphene-lattice matching material over at least a portion of the graphene material, the graphene-lattice matching material having a lattice constant within about ±5% of a multiple of a lattice constant or bond length of the graphene material.

2. The semiconductor structure of claim 1, wherein the semiconductor structure has an energy band gap of at least about 0.5 eV.

3. The semiconductor structure of claim 1, wherein the semiconductor structure has an energy band gap of from about 1 eV to about 2 eV.

4. The semiconductor structure of claim 1, wherein the graphene-lattice matching material is a graphene-lattice matching, oxygen-containing material.

5. The semiconductor structure of claim 1, comprising more than three monolayers or less than three monolayers of the graphene-lattice matching material over the graphene material.

6. The semiconductor structure of claim 1, comprising at least three monolayers of the graphene-lattice matching material over the graphene material.

7. The semiconductor structure of claim 1, wherein the graphene-lattice matching material is a dielectric material.

8. The semiconductor structure of claim 1, wherein the graphene-lattice matching material exhibits a hexagonal crystal structure.

9. The semiconductor structure of claim 1, wherein the graphene-lattice matching material comprises a material selected from the group consisting of magnesium carbonate, aluminum borate, $Ni_3TeO_6$, $Li_2ReO_3$, $LiNbO_3$, $NiTiO_3$, $MgTiO_3$, $MgSiO_3$, $FeTiO_3$, $GeMnO_3$, $LiAsO_3$, $Al_2O_3$, $Ti_2O_3$, $Rh_2O_3$, $Fe_2O_3$, $Cr_2O_3$, $CaCO_3$, $V_2O_3$, $LuBO_3$, $MnCO_3$, $FeCO_3$, $Ga_2O_3$, $YbBO_3$, and $NaNO_3$.

10. The semiconductor structure of claim 1, further comprising a crystallized Cu (111) material on an oxidized silicon material, the graphene material on the crystallized Cu (111) material.

11. A semiconductor device comprising:
a source;
a drain;
a gate structure; and
a semiconducting graphene structure adjacent to at least one of the source and the drain, the semiconducting graphene structure comprising:

a graphene material, and a graphene-lattice matching material over at least a portion of the graphene material, the graphene-lattice matching material having a lattice constant within about ±5% of a multiple of a lattice constant or bond length of the graphene material.

12. The semiconductor device of claim 11, wherein at least one of the source and the drain comprises unmodified graphene.

13. The semiconductor device of claim 11, wherein the graphene-lattice matching material is in direct contact with the gate structure.

14. The semiconductor device of claim 11, further comprising a gate dielectric material overlying the graphene-lattice matching material of the semiconducting graphene structure, the gate structure overlying the gate dielectric material.

15. The semiconductor device of claim 11, wherein the semiconductor device is selected from the group consisting of a field-effect transistor (FET), a diode, a triode, and a resistant switching device.

16. A method of modifying an energy band gap of a graphene material, the method comprising:

forming a graphene-lattice matching material over at least a portion of a graphene material, the graphene-lattice matching material having a lattice constant within about ±5% of a multiple of a lattice constant or bond length of the graphene material.

17. The method of claim 16, wherein forming a graphene-lattice matching material over at least a portion of a graphene material comprises forming the graphene-lattice matching material over the at least a portion of the graphene material without alternating periodicity of the graphene material.

18. The method of claim 16, wherein forming a graphene-lattice matching material over at least a portion of a graphene material comprises bonding the graphene-lattice matching material to the graphene material.

19. The method of claim 16, wherein forming a graphene-lattice matching material on at least a portion of a graphene material comprises increasing an energy band gap of the graphene material to about at least 0.5 eV.

20. The method of claim 16, wherein forming a graphene-lattice matching material over at least a portion of a graphene material comprises aligning unit cell vectors of the graphene-lattice matching material to a lattice vector of the graphene material.

21. The method of claim 16, wherein forming a graphene-lattice matching material over at least a portion of a graphene material comprises aligning unit cell vectors of the graphene-lattice matching material to graphene bonds of the graphene material.

* * * * *